United States Patent
Asano et al.

(10) Patent No.: US 6,853,072 B2
(45) Date of Patent: Feb. 8, 2005

(54) SEMICONDUCTOR SWITCHING CIRCUIT DEVICE AND MANUFACTURING METHOD THEREOF

(75) Inventors: Tetsuro Asano, Oizumi-machi (JP); Mikito Sakakibara, Menuma-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/414,490

(22) Filed: Apr. 16, 2003

(65) Prior Publication Data

US 2004/0021156 A1 Feb. 5, 2004

(30) Foreign Application Priority Data

Apr. 17, 2002 (JP) ........................................ 2000-114959

(51) Int. Cl.[7] .............................................. H01L 23/34
(52) U.S. Cl. ...................... 257/728; 257/393; 257/183; 257/187; 333/262; 200/181
(58) Field of Search ................................ 257/393, 183, 257/187; 333/262; 200/181

(56) References Cited

U.S. PATENT DOCUMENTS

| 6,258,606 B1 | 7/2001 | Kovacs ........................ 436/149 |
| 6,472,962 B1 | 10/2002 | Guo et al. ................... 333/262 |
| 6,531,668 B1 | 3/2003 | Ma .............................. 200/181 |
| 6,657,266 B2 | 12/2003 | Hirai et al. .................. 257/393 |

*Primary Examiner*—David Nelms
*Assistant Examiner*—Mai-Huong Tran
(74) *Attorney, Agent, or Firm*—Morrison & Foerster LLP (57) ABSTRACT

Posts are disposed at the surroundings of an FET and a shield metal supported by the posts is placed above the FET to create a void between the FET and the shield metal. Since the separation between the FET and the shield metal is small, the resin does not enter the void. A resin layer cover the shield metal. The shield metal is connected to an electrode pad that receives a DC control signal. Although high frequency signals that are applied to the FET may leak between the source and drain electrodes of the FET through the resin layer covering the FET even when the FET is switched off, the void and the shield metal prevent such signal leakage.

17 Claims, 13 Drawing Sheets

SEMICONDUCTOR SWITCHING CIRCUIT DEVICE AND MANUFACTURING METHOD THEREOF

BACKGROUND OF THE INVENTION

1. Field of the Invention

This invention relates to a semiconductor switching circuit device to be used for high-frequency switching applications and a method of manufacture thereof, and particularly relates to a semiconductor switching circuit device with improved isolation at high frequencies and a method of manufacture thereof.

2. Description of the Related Art

Portable telephones and other mobile communication equipment use microwaves of the GHz band in many cases and switching elements for switching such high frequency signals are often used in a switching circuit for antennas and a circuit switching between transmitting and receiving, such as the ones described in Japanese Laid-Open Patent Publication No. Hei-9-181642. A field effect transistor (referred to hereinafter as "FET") formed on a substrate made of gallium arsenide (GaAs), which has many excellent characteristics for high frequency signal circuits, is used as the switching element in many cases. Monolithic microwave integrated circuits (MMIC), in which these switching elements are integrated, are being developed accordingly.

Figure 9A:
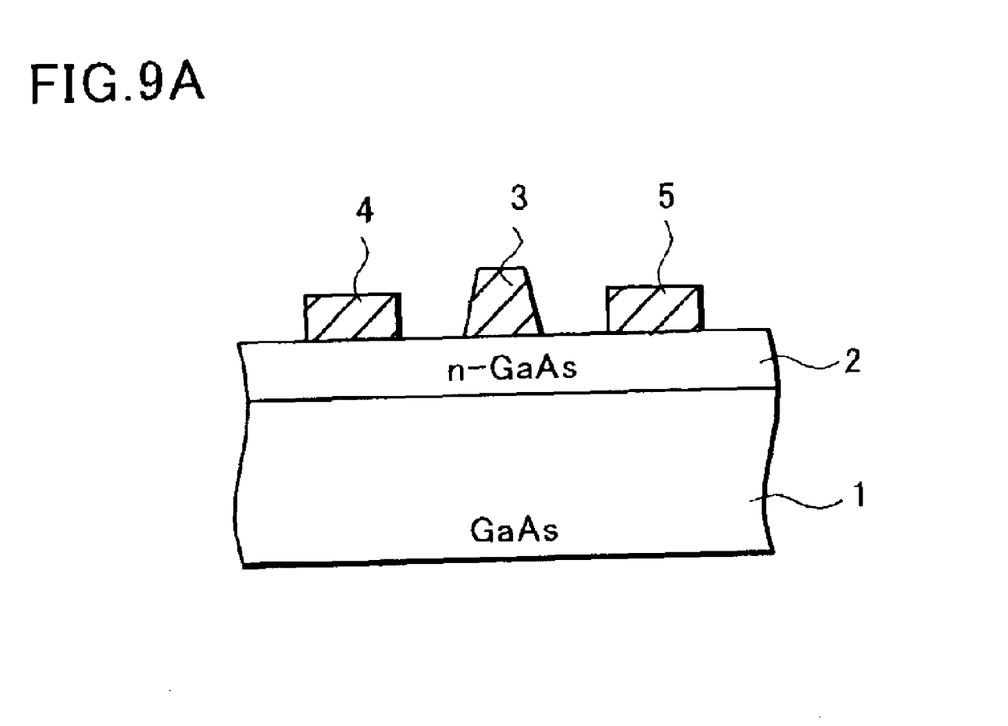
FIG. 9A is a schematic sectional view of a conventional switching circuit device.

FIG. 9A shows a sectional view of a GaAs-based MESFET (metal-semiconductor field effect transistor). An N-type channel region 2 is formed by doping a surface part of an undoped GaAs substrate 1 with an N-type impurity, a gate electrode 3 is placed to be in Schottky contact with the channel region 2 surface, and source and drain electrodes 4 and 5, which are in ohmic contact with the GaAs surface, are placed at both sides of gate electrode 3. With this transistor, the potential of gate electrode 3 is used to form a depleted layer in the channel region 2 immediately below, and the channel current between the source electrode 4 and the drain electrode 5 is controlled thereby.

Figure 9B:
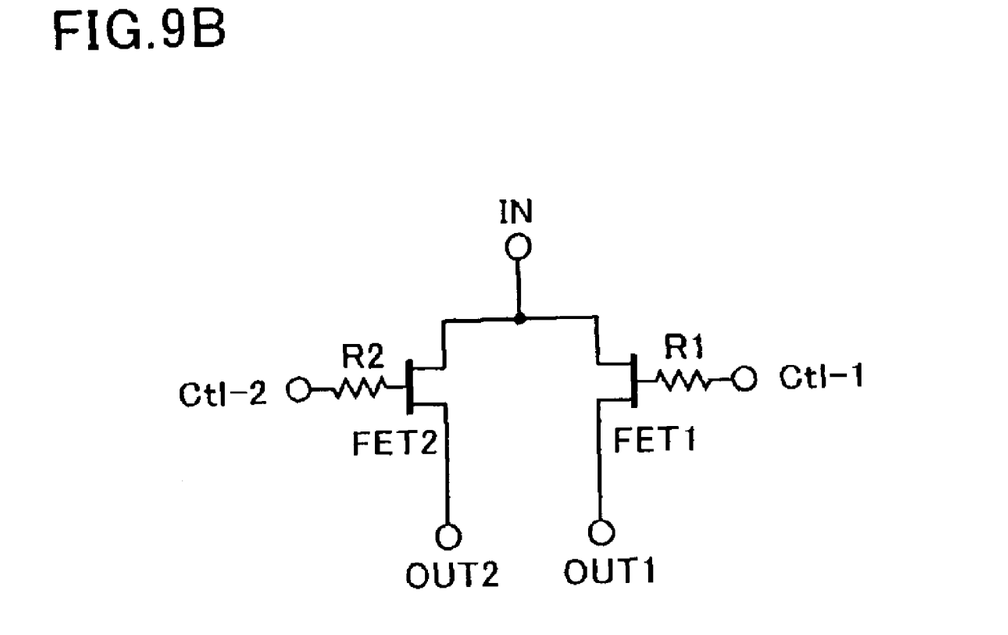
FIG. 9B is a circuit diagram of the device of FIG. 9A.

FIG. 9B is a basic circuit diagram of a compound semiconductor switching circuit device, which is called an SPDT (Single Pole Double Throw) and uses a GaAs FET.

The sources (or drains) of first and second FET's, FET1 and FET2, are connected to a common input terminal IN, the gates of FET1 and FET2 are connected to first and second control terminals Ctl-1 and Ctl-2, respectively, via resistors R1 and R2, respectively, and the drains (or sources) of FET1 and FET2 are connected to first and second output terminals OUT1 and OUT2, respectively. The signals that are applied to first and second control terminals Ctl-1 and Ctl-2 are complementary signals and the FET to which the H level signal is applied turns on to allow the signal applied to the input terminal IN to reach one of the output terminals. Resistors R1 and R2 are placed to prevent the high-frequency signal from leaking via the gate electrodes to the DC potential of the control terminals Ctl-1 and Ctl-2, which are AC grounded.

Figure 10:
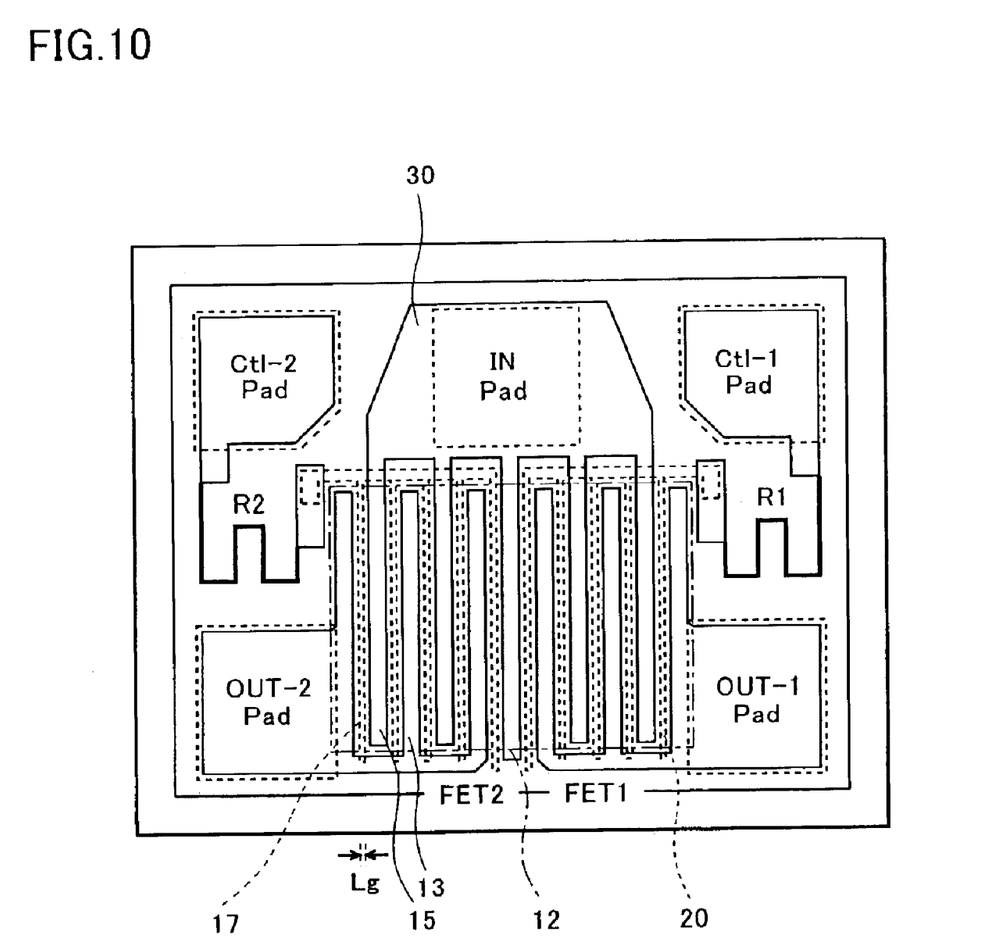
FIG. 10 is a plan view of the switching circuit device of FIG. 9A.

FIG. 10 shows an example of a compound semiconductor chip in which the compound semiconductor switching circuit device shown in FIG. 9 is integrated.

FET1 and FET2, which perform switching, are placed at the central parts of a GaAs substrate and resistors R1 and R2 are connected to the respective gate electrodes of the FET's. Also, electrode pads INPad, OUT1Pad, OUT2Pad, Ctl-1Pad, and Ctl-2Pad, corresponding to the common input terminal, the output terminals and the control terminals, respectively, are placed at peripheral parts of the substrate. A gate metal layer (Ti/Pt/Au) 20, which is formed at the same time as the forming of the gate electrodes of the respective FET's, is a second-layer wiring, indicated by dotted lines, and a pad metal layer (Ti/Pt/Au) 30, which connects the respective elements and forms the pads, is a third-layer wiring, indicated by solid lines. An ohmic metal layer (AuGe/Ni/Au), which is in ohmic contact with the substrate, is a first-layer wiring, and forms the source electrodes and drain electrodes of the respective FET's and take-out electrodes of the respective resistors. This layer is not illustrated in FIG. 10 as it overlaps with the pad metal layer.

Figure 11A:
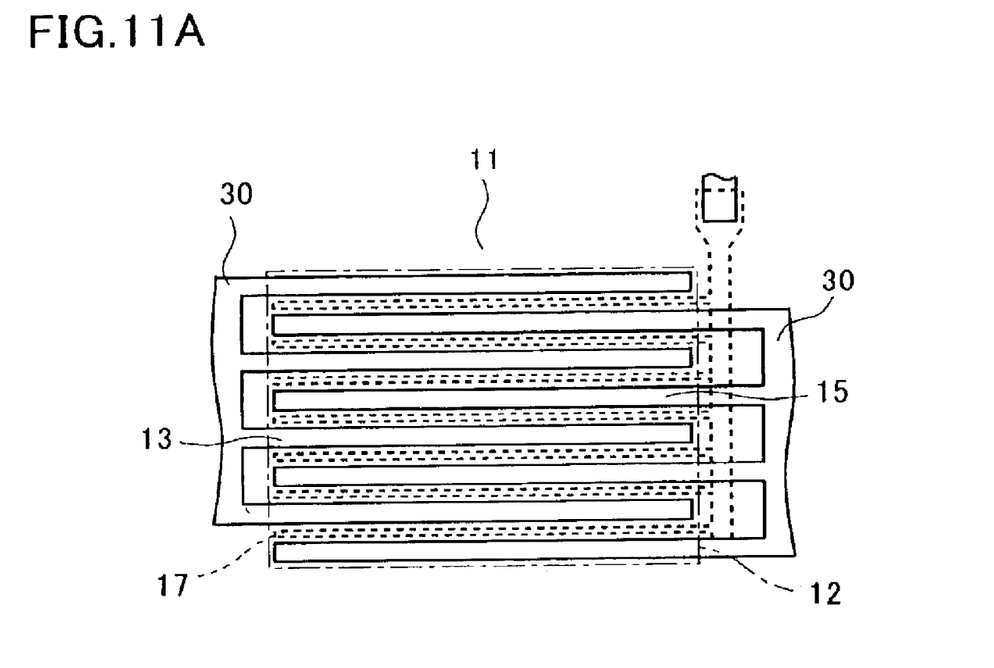
FIG. 11A is a partially expanded view of the switching circuit device of FIG. 10.

FIG. 11A is an enlarged plan view of the FET1 shown in FIG. 10. The rectangular region surrounded by alternate long and short dash lines is a channel region 12 that is formed on the substrate 11. The third-layer pad metal layer 30, which takes on the form of comb teeth that extend from the left side, is a source electrode 13 (or drain electrode) that is connected to output terminal OUT1, and a source electrode 14 (or drain electrode), formed by the first-layer ohmic layer 10, is placed below the electrode 13. Also, the third-layer pad metal layer 30 part, which takes on the form of comb teeth that extend from the right side, is a drain electrode 15 (or source electrode) that is connected to common input terminal IN, and a drain electrode 16 (or source electrode), formed by the first-layer ohmic layer 10, is placed below the electrode 15. These electrodes are interdigitated and a gate electrode 17, formed on the channel region 12, is placed in between in the two electrodes.

Figure 11B:
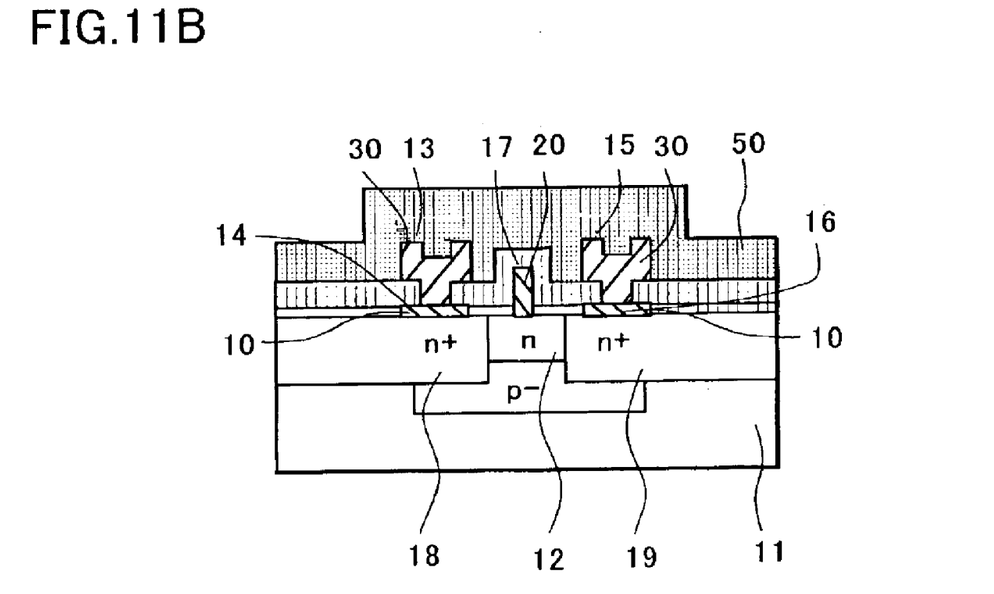
FIG. 11B is a partial sectional view of the switching circuit device of FIG. 10.

A sectional view of a part of this FET is shown in FIG. 11B. An n-type channel region 12 and n+-type high concentration regions, which form a source region 18 and a drain region 19 at both sides of channel region 12, are formed on the substrate 11. The gate electrode 17 is placed on channel region 12, and the drain electrode 14 and the source electrode 16, which are made of the first-layer ohmic metal layer 10, are placed on the respective high concentration regions. The pad metal layer 30, which is the third and top layer wiring, also provides connection between the device elements.

Figure 12A:
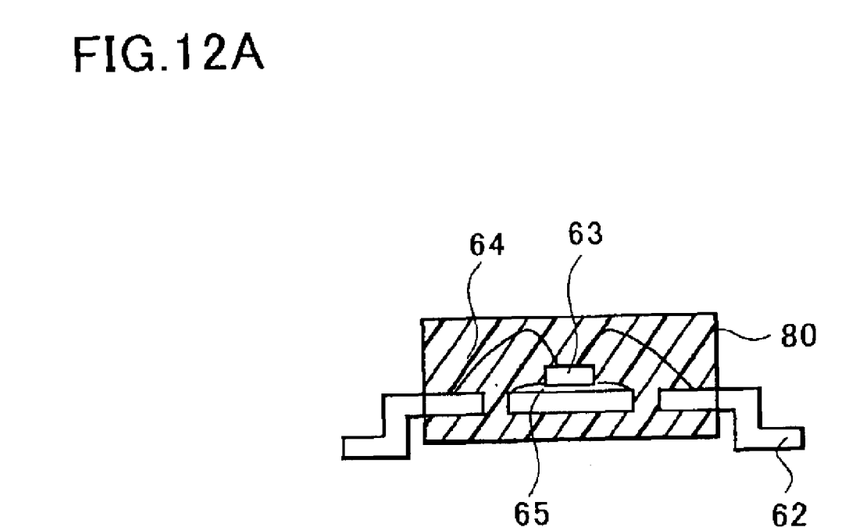
FIGS. 12A and 12B are sectional views of a packaging structure of the switching circuit device of FIG. 10.
Figure 12B:
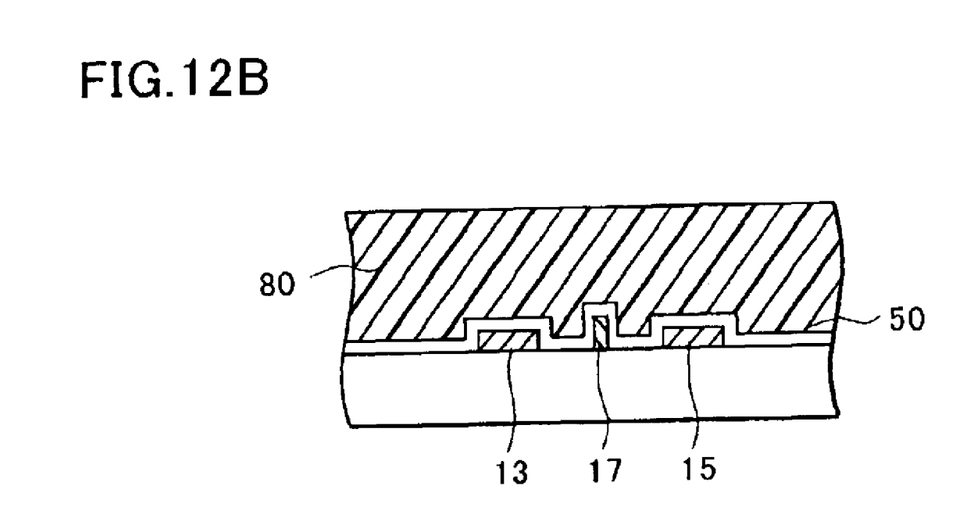

FIGS. 12A and 12B show a section of a packaging structure for the semiconductor chip of FIG. 10. FIG. 12A shows a sectional view of the package, and FIG. 12B is a schematic magnified sectional of the packaged FET. A nitride film 50 is formed as a protective film over the entire surface of the chip except above the electrode pads used as the terminals. The compound semiconductor chip 63 is mounted on an island of lead 62 using a conductive paste 65, and the electrode pads of compound semiconductor chip 63 are connected to leads 62 by bonding wires 64. The semiconductor chip 63 is covered by a resin layer 80 using a mold die corresponding to the shape of the packaging. The tip parts of leads 62 extend out of the resin layer 80.

Because of the requirements for wireless networks that enable information transmission at higher density, the operation frequency of those switching circuits is shifting from the 2.4 GHz band to the 5 GHz band. However, it has become known that when the conventional compound semiconductor switching circuit device is used, the isolation becomes less than the designed value. In the conventional switching circuit shown in FIGS. 10 and 12B, when FET1 is on, FET2 is off. In other words, the high-frequency signal that is input into FET2 is not supposed to pass between the source and drain electrodes of FET2, that is, between the common input terminal IN and the output terminal OUT2.

However, this is not the case in the conventional device. Because the source electrode—drain electrode distance is extremely fine, for example 3 µm, the high frequency signals pass between the two electrodes through the mold resin layer. Accordingly, the isolation is less than the designed value of the switching circuit.

This leakage of the high frequency signals is not much of problem at the frequency band of 2.4 GHz, as in the case of 2.4 GHz-band wireless LAN and Bluetooth applications, among other applications. However, the degradation of isolation becomes a major a problem at the high frequency band of 5 GHz or higher.

SUMMARY OF THE INVENTION

The invention provides a semiconductor switching circuit device that includes a field effect transistor having a source electrode, a gate electrode and a drain electrode, a first electrode pad connected to the source electrode or the drain electrode, and a second electrode pad connected to the source electrode or the drain electrode which is not connected to the first electrode pad. The device also includes a metal layer disposed above the transistor so that a void is created between the metal layer and the transistor, and a layer made of a resin disposed on the metal layer.

The invention also provides a semiconductor switching circuit device that includes a field effect transistor having a source electrode, a gate electrode and a drain electrode, a signal input electrode pad receiving a high frequency signal and connected to the source electrode or the drain electrode, a signal output electrode pad outputting the high frequency signal and connected to the source electrode or the drain electrode which is not connected to the signal input electrode pad, and a control electrode pad receiving a control signal and applying the control signal to the gate electrode. The device also includes means for preventing the high frequency signal from leaking between the source electrode and the drain electrode when the field effect transistor is switched off and the high frequency signal is applied to the signal input electrode pad.

The invention further provides a method of manufacturing a semiconductor switching circuit device. The method includes forming a thin film transistor on a substrate, forming a plurality of posts and a metal layer supported by the posts so that the metal layer is disposed above the transistor and covers the transistor, and disposing a resin layer on the metal layer.

The invention provides a semiconductor switching circuit device that includes a compound semiconductor substrate, a field effect transistor formed on the substrate and having a source electrode, a gate electrode and a drain electrode, a first electrode pad connected to the source electrode or the drain electrode, and a second electrode pad connected to the source electrode or the drain electrode which is not connected to the first electrode pad. The device also includes a metal post standing on a high impurity region formed on the substrate, and a metal layer disposed above the transistor and supported by the metal post.

The invention also provides a semiconductor switching circuit device that includes a silicon substrate, a field effect transistor formed on the substrate and having a source electrode, a gate electrode and a drain electrode, a first electrode pad connected to the source electrode or the drain electrode, and a second electrode pad connected to the source electrode or the drain electrode which is not connected to the first electrode pad. The device also includes a metal post standing on a dielectric layer formed on the substrate, and a metal layer disposed above the transistor and supported by the metal post.

The invention further provides a semiconductor switching circuit device that includes a silicon substrate, a field effect transistor formed on the substrate and having a source electrode, a gate electrode and a drain electrode, a first electrode pad connected to the source electrode or the drain electrode, and a second electrode pad connected to the source electrode or the drain electrode which is not connected to the first electrode pad. The device also includes a metal post standing on a portion of the substrate, the portion being at a ground voltage, and a metal layer disposed above the transistor and supported by the metal post.

The invention also provides a method of manufacturing a semiconductor switching circuit device. The method includes providing a compound semiconductor substrate, forming a high impurity region on the substrate, and forming a field effect transistor on the substrate. The method also includes forming a plurality of posts and a metal layer supported by the posts so that the metal layer is disposed above the transistor and covers the transistor and that one of the posts stands on the high impurity region. A resin layer is disposed on the metal layer.

DETAILED DESCRIPTION OF THE INVENTION

Semiconductor switching circuit device of the embodiments of this invention will be described with reference to FIGS. 1–8. Compound semiconductor switching devices are used as examples to describe these embodiments.

Figure 1:
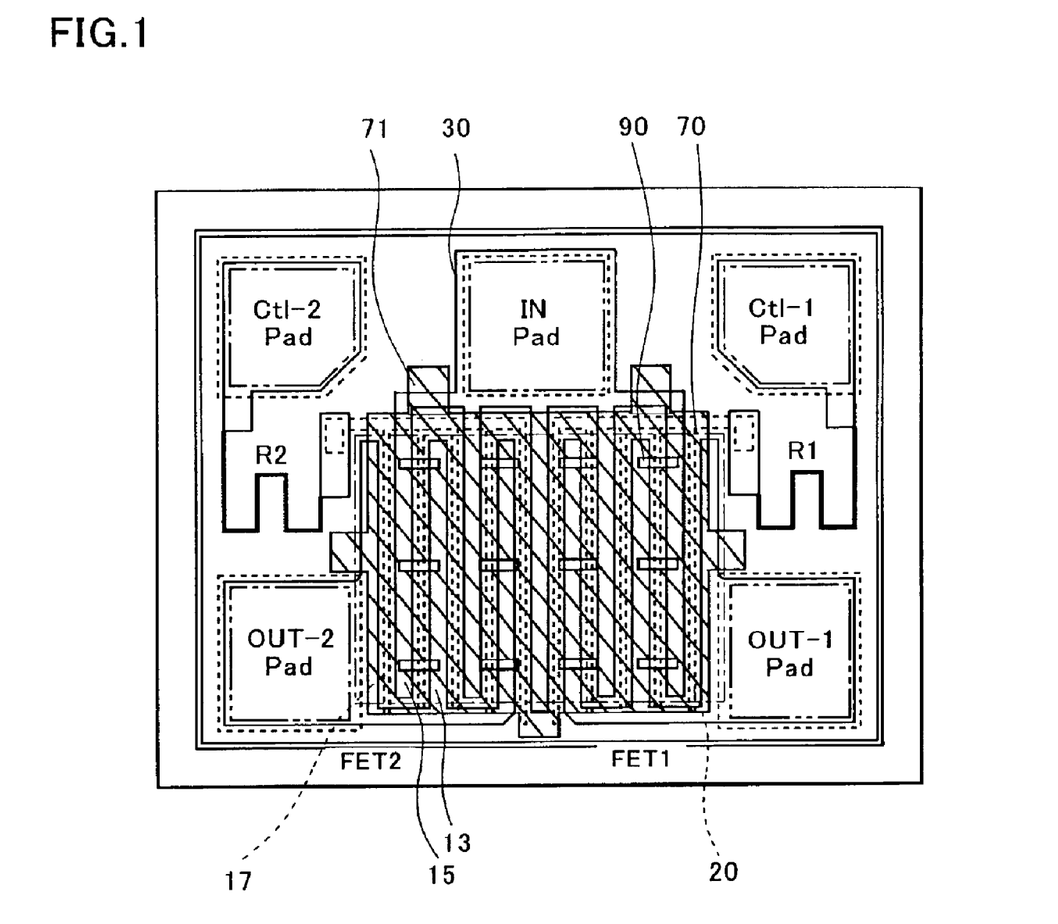
FIG. 1 is a plan view of a switching circuit device of a first embodiment of this invention.

FIG. 1 shows a compound semiconductor chip of a first embodiment of this invention. Switching transistors, FET1 and FET2, are placed at central parts of a GaAs substrate and resistors R1 and R2 are connected to the respective gate electrodes of the FET's. Also, electrode pads INPad, OUT1Pad, OUT2Pad, Ctl-1Pad, and Ctl-2Pad, corresponding to the common input terminal, the output terminals, and the control terminals, respectively, are placed at peripheral parts of the substrate. A gate metal layer (Ti/Pt/Au) 20, which is formed at the same time as the forming of the gate electrodes of the respective FET's, is a second-layer wiring, indicated by dotted lines, and a pad metal layer (Ti/Pt/Au) 30, which connects the respective elements and form the pads, is a third-layer wiring, indicated by solid lines. An ohmic metal layer (AuGe/Ni/Au), which is in ohmic contact with the substrate, is a first-layer wiring, and forms the source electrodes and drain electrodes of the respective FET's and take-out electrodes of the respective resistors. This layer is not illustrated in FIG. 1 as it overlaps with the pad metal layer. A nitride passivation film covers the two FET's as well as the surface of the substrate.

The nitride film is partially removed to expose the top surface of the GaAs substrate, and posts 71 are formed on the exposed substrate surface at locations shown in FIG. 1. A shield metal 70 is supported by the posts 71. The shield metal 70 covers the entire area above the FET's and is provided with a plurality of openings, i.e., slits 90 in this embodiment having a width of approximately 2 μm to 5 μm and a length of approximately 15 μm. The slits 90 are positioned in the shield metal 70 with a predetermined pattern.

These slits 90 become paths for a resist removal solution in a resist removal step for realizing a hollow structure underneath the shield metal 70, as described above. Thus as long as the slits are of a size that enables the passage of the resist removal solution without leaving any resist residuals in this hollow structure and of a size which prevents a molding resin form entering the hollow structure, the slits may be of any size or number, and is not limited to those shown in FIG. 1. Bonding wires are press-bonded to the respective electrode pad parts after the removal of the nitride film. The structure below the shield metal 70 of the switching circuit device of FIG. 1 is the same as that of FIG. 10.

Figure 2A:
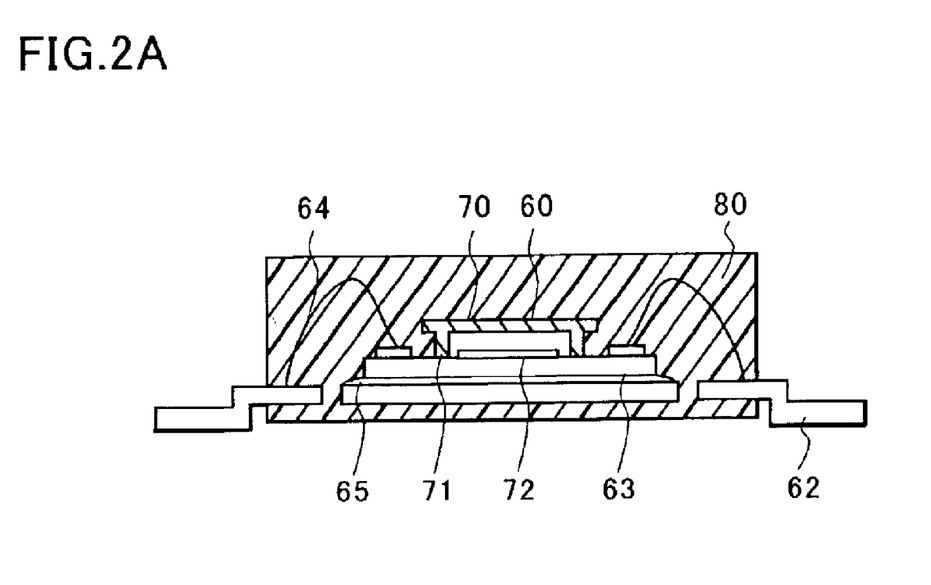
FIGS. 2A–2E are sectional views of the switching circuit device of FIG. 1.
Figure 2B:
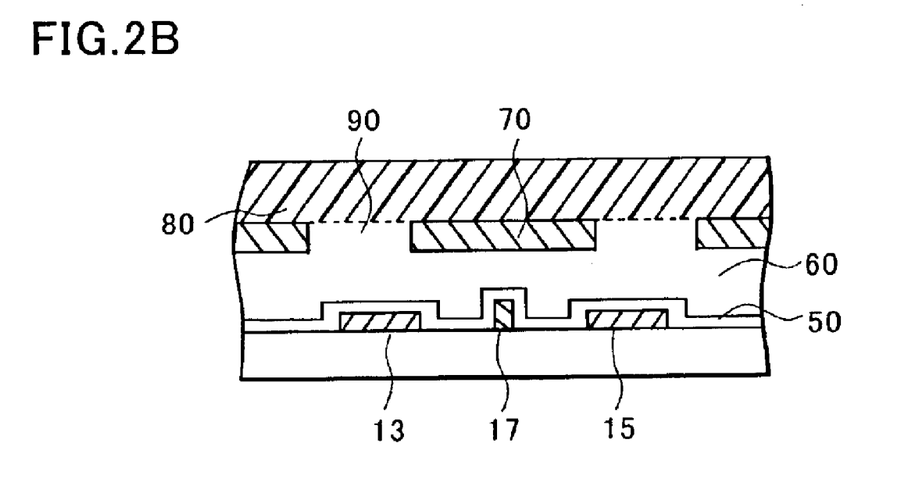

FIGS. 2A and 2B show sectional views of a packaging structure of the chip of FIG. 1 after resin molding. FIG. 2A is a sectional view of the packaging, and FIG. 2B is a partially expanded view of FIG. 2A to show the structure around the FET.

In FIG. 2A, a compound semiconductor chip 63, which is the switching circuit device of FIG. 1, is mounted on an island of lead 62 using a conductive paste 65, and the respective electrode pads of compound semiconductor chip 63 are connected to the leads 62 by bonding wires 64. The semiconductor chip 63 is covered by a resin layer 80 that is molded into the packaging shape, and the ends of the leads 62 extend out of the resin layer 80.

The shield metal 70 is supported by the posts 71 at the positions shown in FIG. 1, and completely covers the area above FET 72. The post 71 and the shield metal 70 are formed as one unit. In this embodiment, the shield metal 70 is formed of a gold plating layer of approximately 2 μm to 7 μm. The FET 72 and the shield metal 70 are separated by a distance of approximately 1 μm to 2 μm. Accordingly, a hollow part 60 is created between the FET 72 and the shield metal 70 as shown in FIGS. 2A and 2B, and the surface of the FET, through which high frequency signals pass, is in contact with no substance except the air. A resin layer 80 covers the chip 63 and the leads 62.

When the chip 63 and the leads 62 are molded together, because the separation of the FET 72 and the shield metal 70 is small, the resin does not enter the hollow part 60. Also, though the shield metal 70 is provided with the slits 90, the molding resin does not pass through these slits as long as the slits are 2 μm to 5 μm in width as in this embodiment.

A gate electrode 17 is placed between a source electrode 13 (or drain electrode 15) used for signal input and a drain electrode 15 (or source electrode 13) used for signal output, as shown in FIG. 2B. The source electrode 13, the drain electrode 15 and the gate electrode 17 are shielded from the resin layer 80 by the shield metal 70 and the hollow part 60. The air contained in the hollow part 60 has an extremely low dielectric constant. Thus, the signal leakage between the source and drain electrodes of the FET that is shut off through the resin layer 80 is effectively prevented.

Figure 2C:
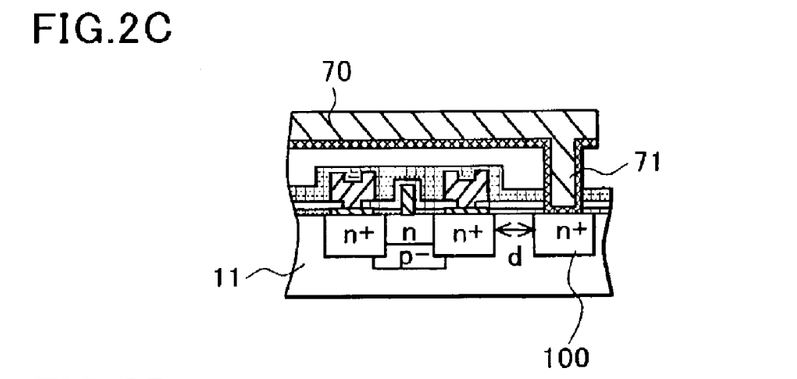

In this embodiment, the post 71 stands directly on a high impurity region 100 of n+ type, which is formed in the GaAs substrate 11, as shown in FIG. 2C. The edge of the high impurity region 100 extends by about 1 μm from the edge of the post. Because this high impurity region 100 prevents the expansion of a depletion region, which is generated between the drain region or the source region and the area underneath the post 71, the distance d between the post 71 and the drain or source region is as small as 4 μm and the interference between the post and the FET is still prevented. The post 71 may also stand on the exposed GaAs surface, which does not have the high impurity region 100 therein. In this configuration, the distance d between the post 71 and the drain or source region should be 20 μm or greater. This large distance is required to prevent the interference despite the free extension of the depletion layer.

The post 71 adheres more firmly to the surface of the GaAs substrate 11 than to dielectric layers, for example a SiNx passivation film, formed on the surface of the GaAs substrate 11. Alloying between the substrate surface and the bottom of the post provides this firm adhesion. A thermal treatment further strengths the bonding between the post 71 and the GaAs substrate 11. As long as the posts 71 do not contact the elements of the switching circuit, the locations of the posts 71 are not limited to those of FIG. 1.

Figure 2D:
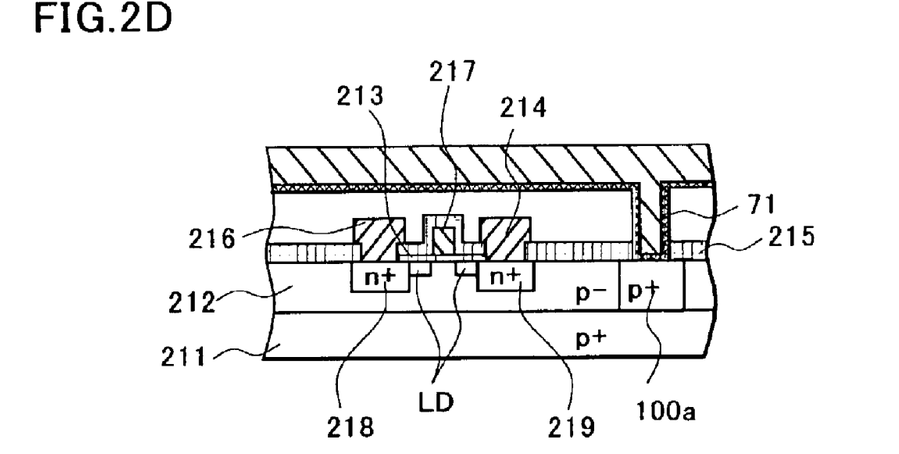
Figure 2E:
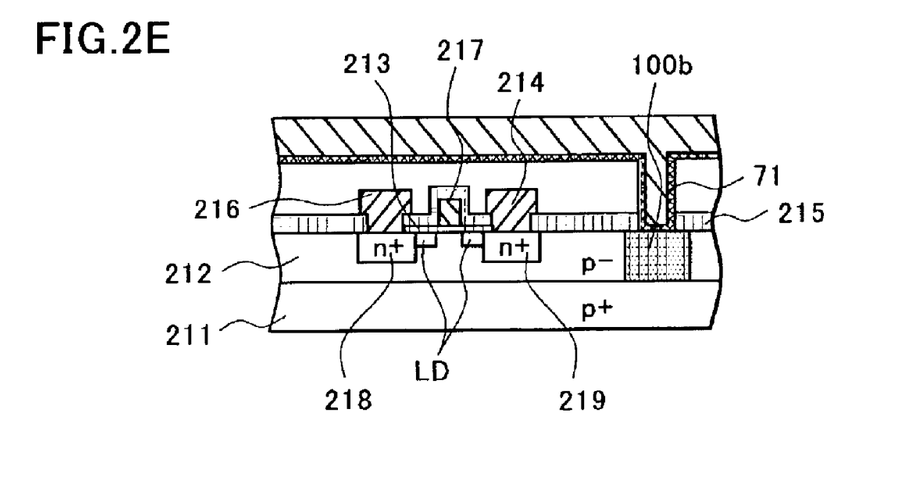

The configuration of this embodiment is also applicable to a switching circuit device based on a silicon substrate. FIGS. 2D and 2E show cross-sectional views of examples of such switching circuit devices. The device of FIG. 2D is formed on a p+ type substrate 211. The device includes a p− type layer 212 formed on the p+ type substrate 211, a source and drain regions 218, 219 of n+ type formed in the p− type layer 212, and two lightly doped regions LD each formed next to the corresponding n+ type regions 218, 219. A channel is a region between the two lightly doped regions LD. The device also includes a gate oxide layer 213, a gate electrode 217, a source electrode 216, a drain electrode 214 and a passivation film 215. The post stands on a p+ type region 100a, which connects to the p+ type substrate 211. Because the substrate 211 is grounded, the post 71 and the shield metal 70 are also grounded through the p+ type region 100a.

The device of FIG. 2E is the same as that of FIG. 2D except that the post 71 stands on a thick dielectric layer 100b formed in the p− type layer 212. Typically, this dielectric layer 100b is a SiO2 layer for LOCOS (local oxidation of silicon) separation. The post 71 may also stand on a passivation film, such as SiNx, as long as there is no device element formed underneath the pasivation film, which would cause interference through the thin passivation film.

In this embodiment, a punched-out lead frame and a transfer molding are used for the packaging. However, a chip size packaging, in which a conductive pattern is formed on an insulating substrate and molding is performed in a batch, is also applicable.

Though an SPDT switch, having a single common input terminal, two FET's and two OUT terminals, is used in this embodiment, the feature of this embodiment, including the hollow structure supported by the shield metal 70 and the resin layer 80, applies to SPDT's with shunt FET's, high-power SPDT's, in which a plurality of FET's are connected in series, DPDT's having two input terminals and two output terminals, and other switching circuit devices as well as switching circuit devices with a GND terminal and a power supply terminal. Other switching devices that may be used in this embodiment includes switching circuit devices that use a multi-gate structure FET for high power applications as well as asymmetric SPDT's, SPST's, SP3T's and SP4T's. In fact, this embodiment may be applicable to all the switching devices including those formed on a silicon-based substrate.

Figure 3:
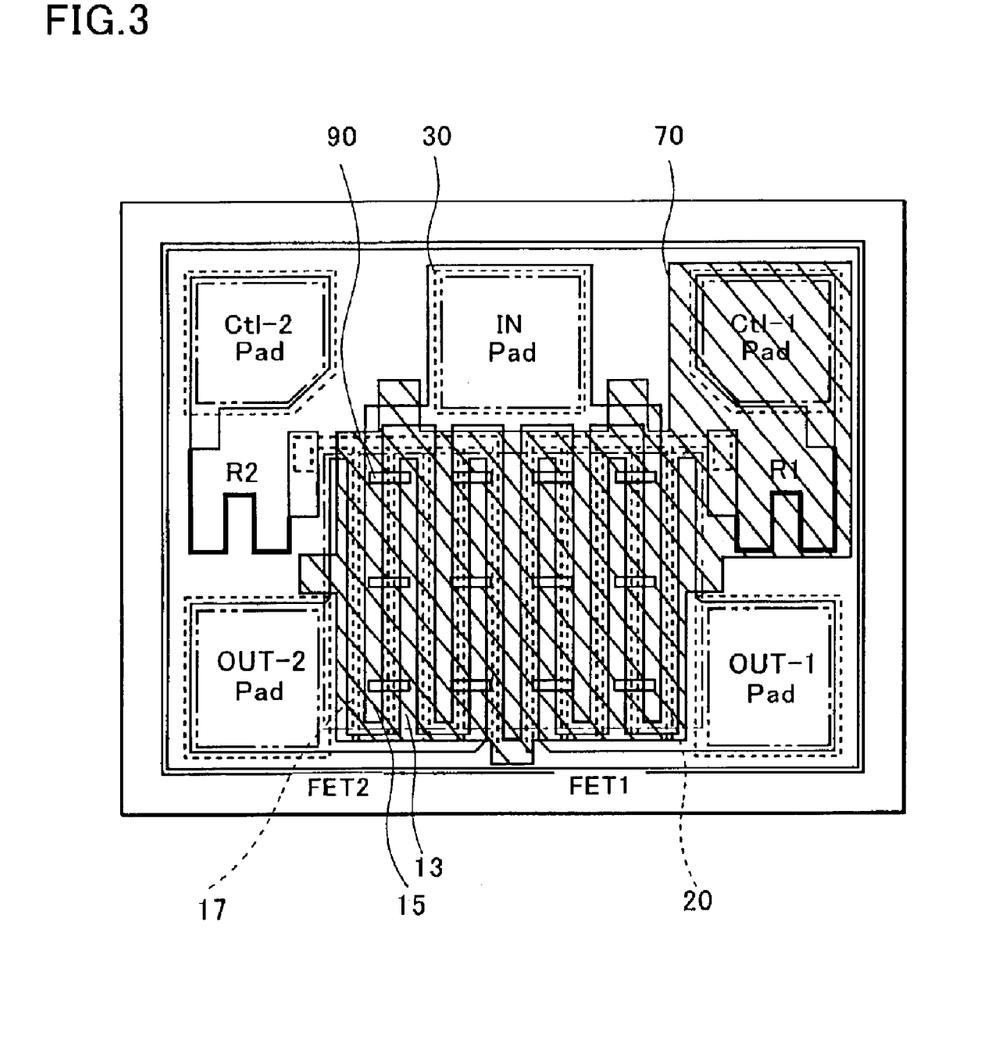
FIG. 3 is a plan view of a switching circuit device of a second embodiment of this invention.
Figure 4A:
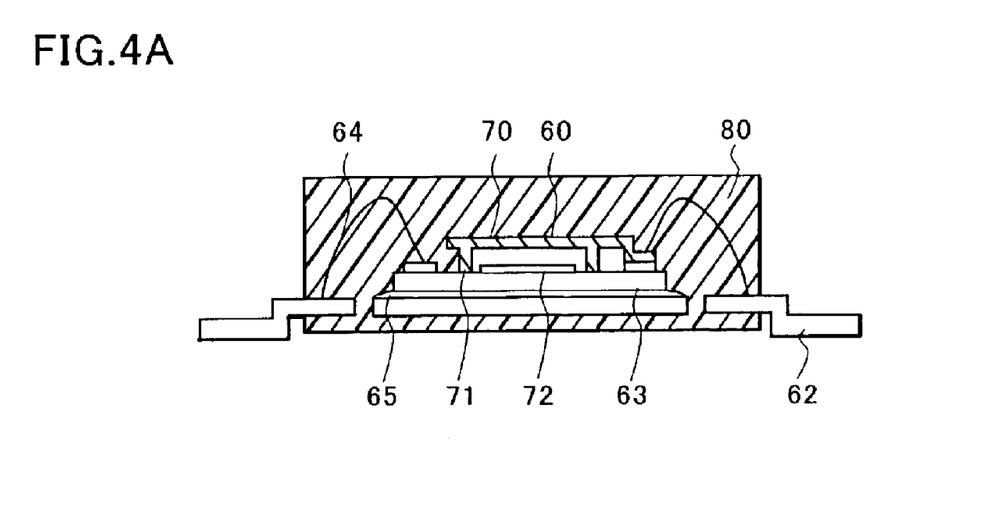
FIGS. 4A, 4B and 4C are sectional views of the switching circuit device of FIG. 3.
Figure 4B:
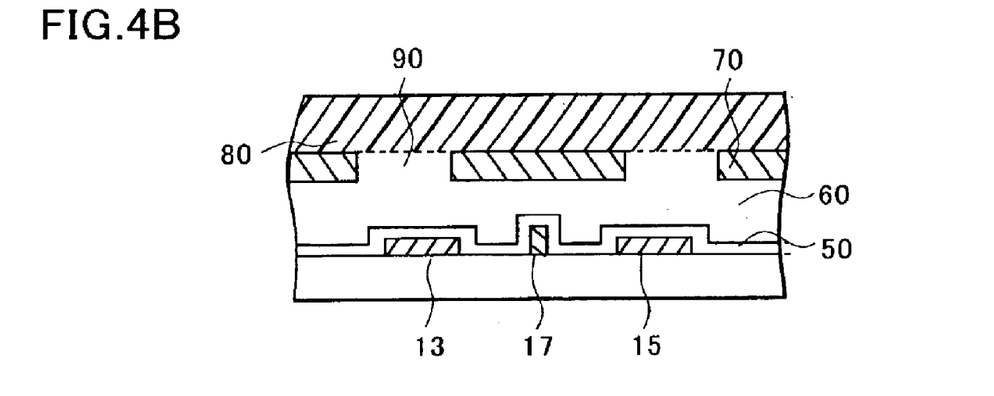
Figure 4C:
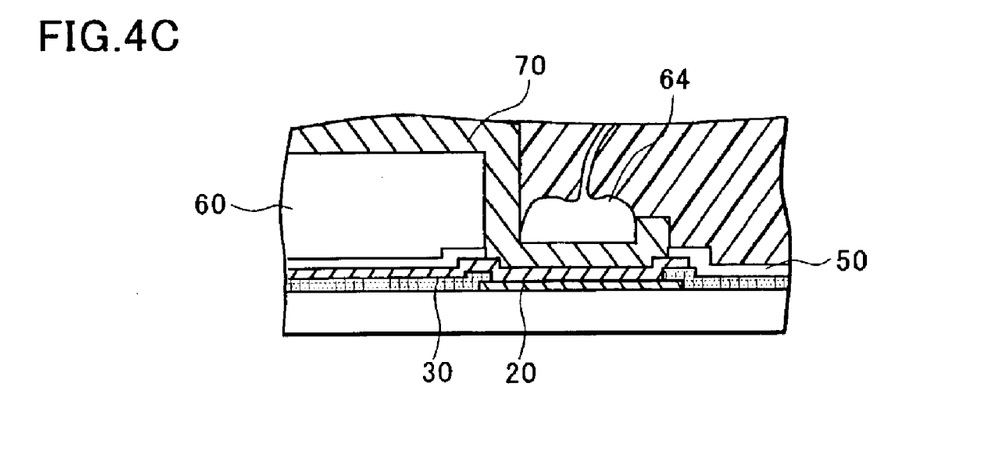

A semiconductor switching circuit device of a second embodiment of this invention is shown in FIGS. 3, 4A, 4B and 4C. As shown in FIG. 3, a shield metal 70 that covers FET's from above extends to and contacts a control terminal electrode pad Ctl-1Pad. FIGS. 4A, 4B and 4C show sectional views of a packaging structure of the chip shown in FIG. 3. Except the configuration of the shield metal 70, the structure of the switching circuit device of the second embodiment is the same as that of the first embodiment, as shown in FIGS. 1, 2A and 2B.

As shown in FIG. 4A, a part of the shield metal 70 extends toward a control terminal electrode pad Ctl-1Pad, and covers this electrode pad. FIG. 4C shows an expanded view of FIG. 4A. The control terminal electrode pad Ctl-1Pad is formed of the gate metal layer 20 and the pad metal layer 30, and the shield metal 70 is in direct contact with the pad metal layer 30 of the electrode pad. A bonding wire 64 is attached to the shield metal 70.

In this embodiment, since a switching operation is performed by applying a control signal of 0V or 3V to the control terminal Ctl-1, a DC potential of 3V or 0V will also be applied to the shield metal 70. Since any DC potential is regarded as a ground potential in terms of high frequency signal applied to the switching device, the source and drain electrodes are shielded by the DC potential from the resin layer 80, which could provide a signal leakage path. In the structure of the first embodiment shown in FIG. 2, the high frequency signals may escape to the resin layer 80 in the form of an electromagnetic field that spreads through the air in the hollow part 60. In this embodiment, however, such a field is prevented from propagating into the resin layer 80 by the shield metal that is connected to the DC potential.

In this embodiment, the shield metal 70 may obviously be put in contact with the control terminal electrode pad Ctl-2 instead. As long as the shield metal 70 is connected with a terminal to which a DC potential is applied, the feature of stopping the electromagnetic field may be accomplished. Thus, the shield metal 70 may be put in contact with a ground terminal electrode pad or a power supply voltage terminal electrode pad when the switching circuit device includes such electrode pads.

When the switching circuit devices based on a silicon substrate shown in FIGS. 2D and 2E are used in this embodiment, any DC potential may be applied to the shield metal 70 in the device of FIG. 2E because the LOCOS $SiO_2$ layer effectively prevents the interference between the post and the transistor elements. However, in the device of FIG. 2D, only a ground potential should be applied to the shield metal 70 because the shield metal 70 is already at the ground potential.

Figure 5:
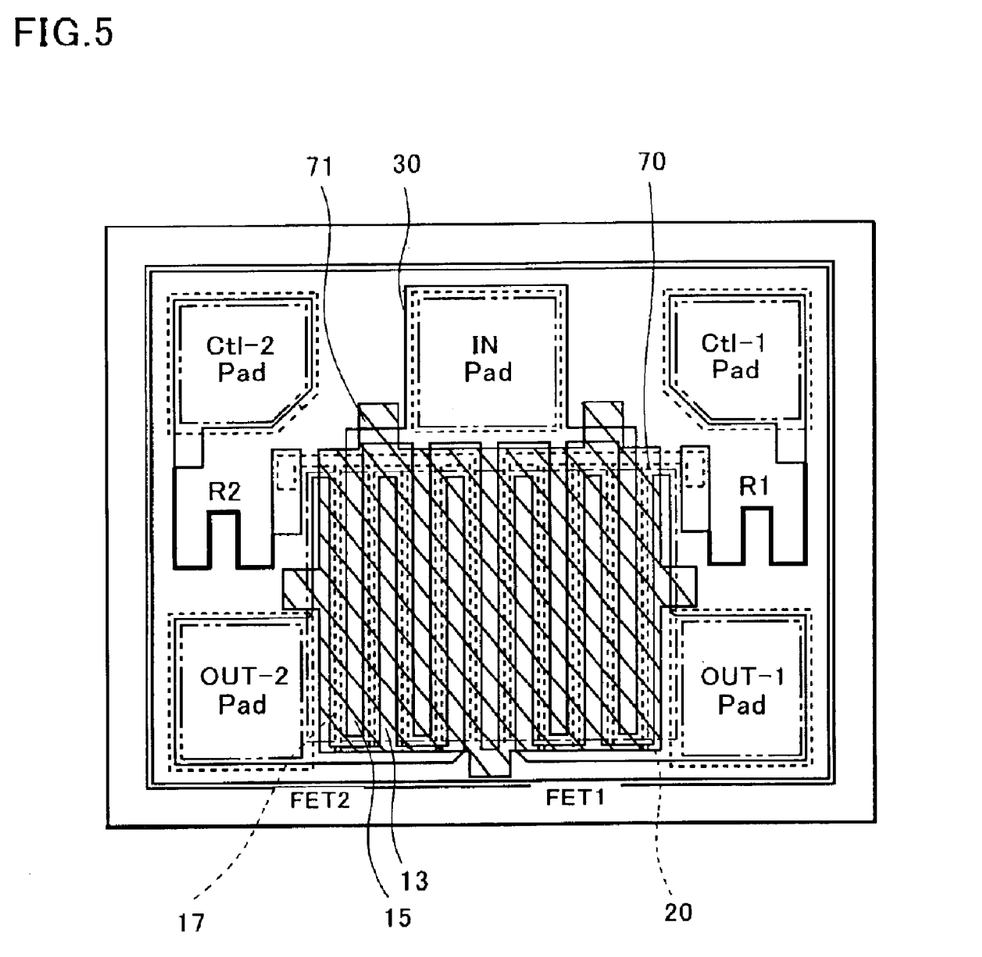
FIG. 5 is a plan view of a switching circuit device of a third embodiment of this invention.

FIG. 5 shows a semiconductor switching circuit device of a third embodiment of this invention. This embodiment has a structure in which a shield metal 70 is not provided with slits. As described in detail below, a hollow structure is created by placing the shield metal 70 above a resist and thereafter removing the resist. Also in order to eliminate the remaining resist from the hollow structure, slits may be provided in the shield metal 70 as paths for a resist removal solution. However, if the resist region to be removed, i.e., the hollow part 60, is relatively small in area, the resist can be removed without providing slits. To be more specific, if the area of the FET part for which the hollow structure is provided is no more than 50 $\mu$m×50 $\mu$m, the shield metal can be disposed over the entire surface without providing slits, and the FET can be shielded completely from the resin layer by the shield metal 70.

The manufacturing methods of the switching circuit device described above will be described with reference to FIGS. 6A to 8B.

Figure 6A:
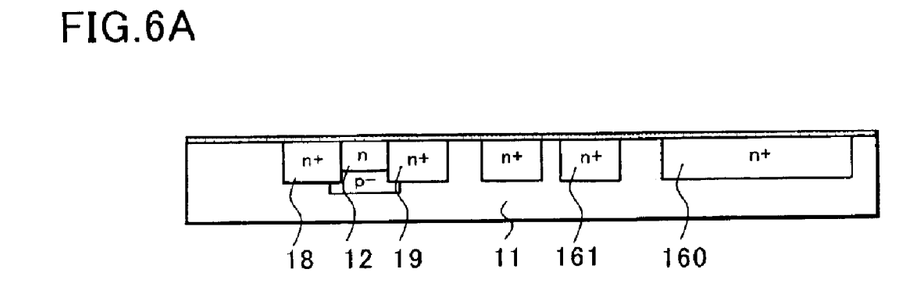
FIGS. 6A, 6B and 6C show process steps for forming a FET in a manufacturing process of the first through the third embodiments.
Figure 6B:
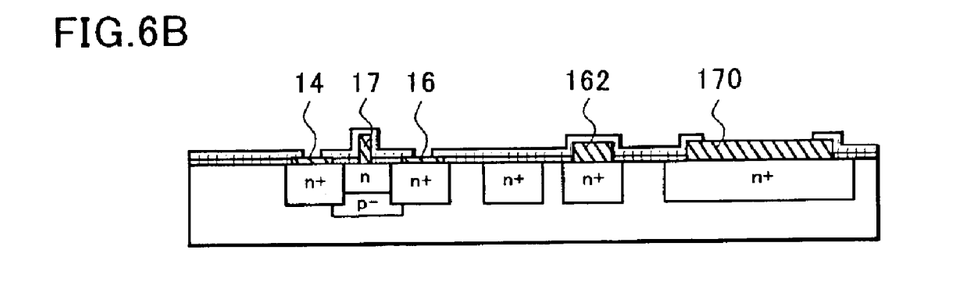
Figure 6C:
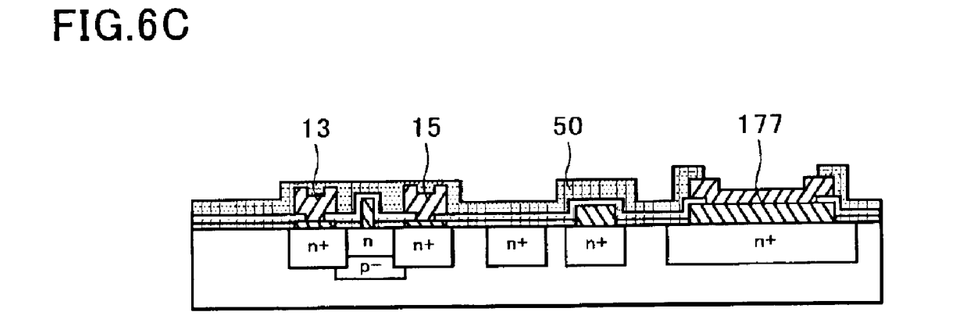

First, a switching circuit device is formed on a semiconductor substrate as shown in FIGS. 6A, 6B and 6C. That is, an FET, having a channel region, source region and drain region, is formed on the semiconductor substrate, and input terminal and output terminal electrode pads, which are connected to the FET, and a terminal electrode pad for applying a DC potential, are formed.

As shown in FIG. 6A, the entire surface of a compound semiconductor substrate 11, made of GaAs, is covered with a silicon nitride film for through-ion implantation to a thickness of approximately 100 Å to 200 Å. Then, ion implantation of a p$^-$-type impurity ($^{24}$Mg$^+$) and ion implantation of an n-type impurity ($^{29}$Si$^+$) are selectively performed to form a p$^-$-type region on the undoped substrate 11 and an n-type channel layer 12 on top. Furthermore, ion implantation of an n+-type impurity ($^{29}$Si$^+$) is performed to form a source region 18 and a drain region 19 as well as high impurity regions 160, 161 below a wiring layer 162 and a pad electrode 170, respectively. Another high impurity region is formed next to the high impurity region 161 at a location for post construction. The source region 18, the drain region 19 and the high impurity regions 160, 161 are formed at the same ion implantation process. The high impurity regions 160, 161 are a little larger than the corresponding electrode pad 170 and wiring layer 162, and provides an adequate isolation between the pad electrode 170 and the wiring layer 162 even if these are placed directly on the GaAs substrate. It should be noted that only one tooth of the FET comb structure is shown in the drawings.

As shown in FIG. 6B, three layers of AnGe/Ni/Au, which are to become an ohmic metal layer, are vacuum vapor deposited successively to form a first source electrode 14 and a first drain electrode 16 as first-layer electrodes on the source region 18 and drain region 19. Subsequently, ohmic junctions of first source electrode 14 and source region 18 and of first drain electrode 16 and drain region 19 are formed by a heat treatment.

Also, three layers of Ti/Pt/Au, which are to become a gate metal layer, are vacuum vapor deposited successively to form a gate 17, which contacts channel layer 12, a first pad electrode 170 and a wiring layer 162 on the channel layer 12 and the high impurity regions 160, 161, respectively.

Then, as shown in FIG. 6C, three layers of Ti/Pt/Au, which are to become a pad metal layer, are vacuum vapor deposited successively to form a second source electrode 13, a second drain electrode 15 and a second pad electrode 177 above the first source electrode 14, the first drain electrode 16 and the first pad electrode 170, respectively.

Next the posts are formed around the FET and the shield metal is formed on the posts.

Figure 7A:
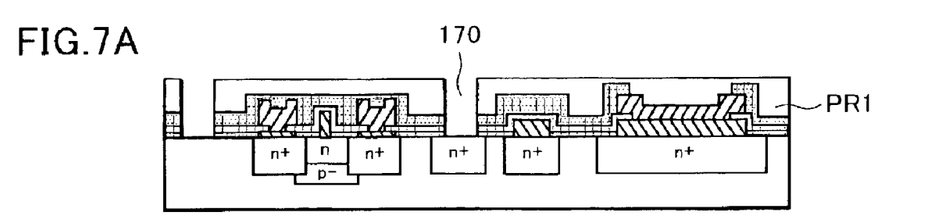
FIGS. 7A through 7E show process steps for forming a shield metal over the FET in the manufacturing process of the first and the second embodiments.

As shown in FIG. 7A, a resist PR1 is formed over the entire surface, and a photolithography process of selectively opening windows at regions corresponding to the posts 71 is performed to remove the nitride film and expose the GaAs substrate. The high impurity region formed for post construction at the step of FIG. 6A is exposed through the openings of the resist PR1.

Figure 7B:
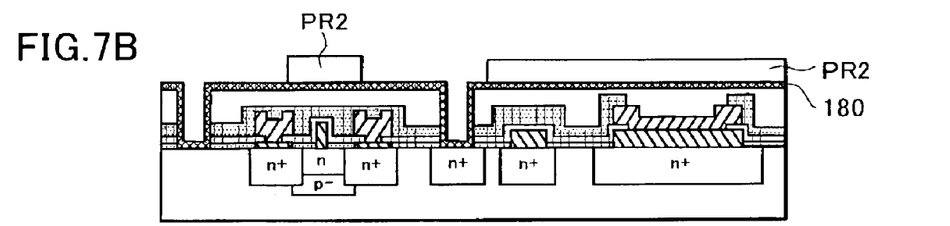

Then as shown in FIG. 7B, three layers of Ti/Pt/Au, for example, are vapor deposited over the entire surface to form a plating substrate metal 180. A new resist PR2 is provided and a photolithography process of selectively opening windows at regions in which the shield metal 70 is to be formed is performed. Also, since the slits are to be formed on the shield metal 70, the resist PR2 is left at portions for the formation of the slits. Since the resist PR2 is applied above the plating substrate metal 180, the resist PR2 is separated completely by this plating substrate metal 180 in the vertical direction from the resist PR1.

Figure 7C:
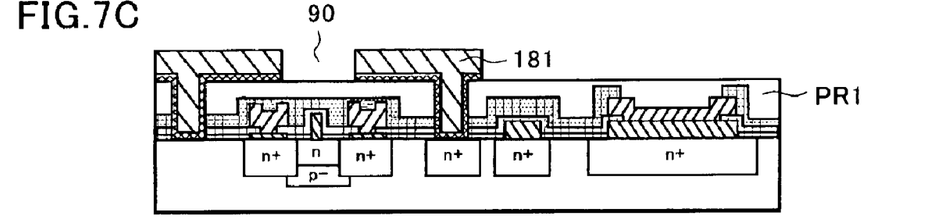

Thereafter, as shown in FIG. 7C, gold plating is applied, photoresist PR2 is removed, and ion milling of the exposed substrate electrode 180 is performed. The shield metal 70, which is joined to the posts 71 and practically covers the entire FET 72 from above, is thereby formed. The post 71 stands on the impurity region for post construction. The slits 90 are also formed at the same time as shown in FIG. 7C.

Furthermore, by removing resist PR1, the hollow part 60 is formed between the FET 72 and the shield metal 70. Without the slits, if the area of the shield metal 70 is large, the resist PR1 cannot be removed completely and the resist PR1 remains in the hollow part. In order to prevent this, the slits 90 are provided in the shield metal 70 and these slits 90 are used as paths for the resist removal solution. The resist removal solution seeps in from between adjacent posts 71 and from slits 90 and completely removes the resist PR1 below the shield metal. The hollow part 60 is thereby formed as shown in FIG. 7D.

It is sufficient that the hollow part 60 above the FET 72 is able to prevent high frequency signals from leaking through the resin layer 80, and thus the hollow part 60 does not have to be thick. Thus, the thickness of the package exterior does not increase by much and increases only by 2 μm to 3 μm in comparison to the conventional device.

In the case of the second embodiment shown in FIG. 3, the part of the control terminal electrode pad Ctl-1Pad, which contacts the shield metal 70, is also opened at the same time in the photolithography step of exposing the post 71 parts of FIG. 7A.

Figure 7D:
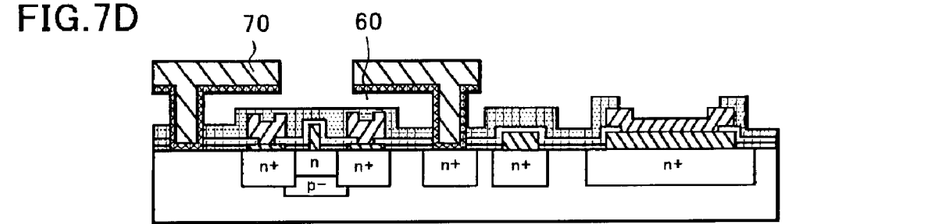
Figure 7E:
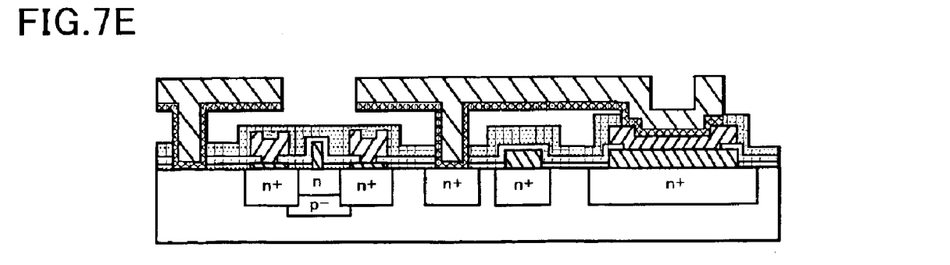

Thereafter, the steps of FIGS. 7B to 7D are carried out to form the shield metal 70, which contacts the control terminal electrode pad Ctl-1Pad as shown in FIG. 7E.

Finally, the chip is covered by a resin layer. When the process steps above have been completed, the semiconductor switching circuit device is transferred to an assembly process. The wafer having the semiconductor chips is diced and separated into individual semiconductor chips. After fixing each semiconductor chip 63 to an island of the lead 62, the electrode pads of semiconductor chip 63 and leads 62 are connected by bonding wires. Thin gold wires are used as bonding wires 64, and the connections are made by a known ball bonding method. Thereafter, transfer molding is performed to provide a resin package to provide the final form, such as shown in FIG. 2A or FIG. 4A.

Since the shield metal 70 is separated from FET 72 by approximately 1 μm to 2 μm, the molding resin does not enter the hollow part 60. Since the slits 90 have a width of approximately 2 μm to 5 μm, the resin does not enter through these slits 90 either. Thus by providing the shield metal 70 supported by the posts 71, the hollow part 60 is formed above the FET by an ordinary resin molding process. The FET 72 and the resin layer 80 are thus shielded by the shield metal 70 and the hollow part 60 containing the air, preventing the leakage of high frequency signals.

It is possible to create a hollow structure by placing a cap on the lead frame on which the semiconductor chip is mounted and resin-molding the entire structure including the cap. However, the extra material cost of the cap and the extra man-hours for handling the cap will be required in such a method. In contrast, in this embodiment, the hollow structure can be obtained just by using a wafer process step of forming a switching circuit element on a wafer, thus providing the advantage of significantly lower cost.

Figure 8A:
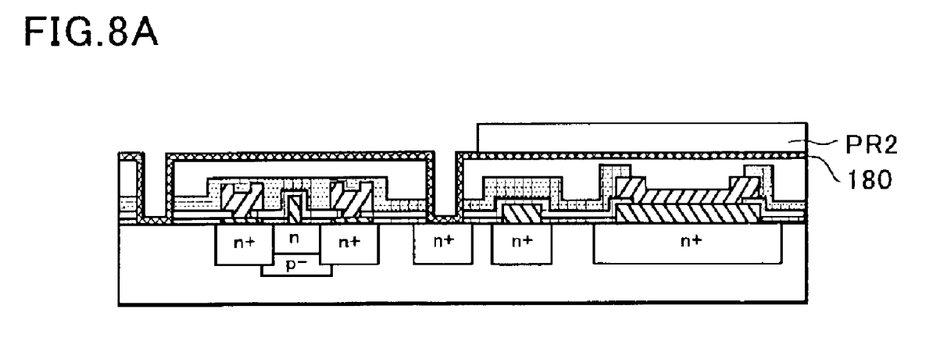
FIGS. 8A and 8B show process steps for forming a shield metal over the FET in the manufacturing process of the third embodiment.
Figure 8B:
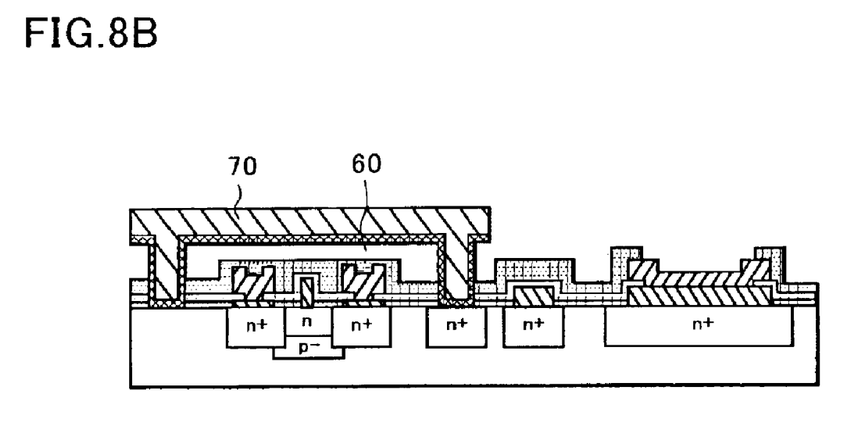

A method of manufacturing the third embodiment is described with reference to FIGS. 8A an 8B. The shield metal 70 is not provided with the slits and the FET is covered completely from above by the shield metal 70. In a case where the FET formation region has a small area of no more than 50 μm×50 μm, the shield metal 70 does not have to be provided with the slits. That is, if the area of the shield metal 70 is small, the resist PR1 can be removed adequately with the resist removal solution that seeps in from between adjacent posts 71.

That is, after forming the switching elements and associated high impurity regions, a photolithography process of selectively opening windows at the post 71 is carried out. After etching the nitride film, the substrate electrode 180 for gold plating is formed. A new resist PR2 is then provided and a photolithography process of selectively opening windows at the shield metal 70 is performed as shown in FIG. 8A.

Thereafter, gold plating is applied, the resist PR2 is removed, and ion milling of the exposed substrate electrode is performed. The resist layer PR1 is then removed to form the hollow part 60, as shown in FIG. 8B.

Subsequently, the resin molding is performed to obtain the final structures of the first through third embodiments.

All the embodiments described above are applicable to semiconductor switching circuit devices formed on a silicon-based substrate.

What is claimed is:

1. A semiconductor switching circuit device comprising:
    a field effect transistor comprising a source electrode, a gate electrode and a drain electrode;
    a first electrode pad connected to the source electrode or the drain electrode;
    a second electrode pad connected to the source electrode or the drain electrode which is not connected to the first electrode pad;
    a metal layer disposed above the transistor so that a void is created between the metal layer and the transistor; and
    a layer made of a resin disposed on the metal layer.

2. The semiconductor switching circuit device of claim 1, further comprising a post supporting the metal layer.

3. The semiconductor switching circuit device of claim 1, wherein the separation between the metal layer and the transistor is such that the resin does not enter the void when the layer made of the resin is formed on the metal layer.

4. The semiconductor switching circuit device of claim 3, wherein the separation is 0.5 μm to 3 μm.

5. The semiconductor switching circuit device of claim 1, wherein the metal layer comprises a layer formed by plating a metal.

6. The semiconductor switching circuit device of claim 1, wherein a plurality of openings are formed in the metal layer.

7. The semiconductor switching circuit device of claim 1, further comprising a third electrode pad receiving a DC voltage and applying the DC voltage to the field effect transistor, wherein the metal layer is connected to the third electrode pad.

8. The semiconductor switching circuit device of claim 1, wherein the metal layer covers the entire transistor.

9. The semiconductor switching circuit device of claim 1, wherein the void is filled with air.

10. The semiconductor switching circuit device of claim 1, wherein the post is in direct contact with a substrate on which the transistor if formed.

11. A semiconductor switching circuit device comprising:
- a field effect transistor comprising a source electrode, a gate electrode and a drain electrode;
- a signal input electrode pad receiving a high frequency signal and connected to the source electrode or the drain electrode;
- a signal output electrode pad outputting the high frequency signal and connected to the source electrode or the drain electrode which is not connected to the signal input electrode pad;
- a control electrode pad receiving a control signal and applying the control signal to the gate electrode; and
- means for preventing the high frequency signal from leaking between the source electrode and the drain electrode when the field effect transistor is switched off and the high frequency signal is applied to the signal input electrode pad.

12. A semiconductor switching circuit device comprising:
- a compound semiconductor substrate;
- a field effect transistor formed on the substrate and comprising a source electrode, a gate electrode and a drain electrode;
- a first electrode pad connected to the source electrode or the drain electrode;
- a second electrode pad connected to the source electrode or the drain electrode which is not connected to the first electrode pad;
- a metal post standing on a high impurity region formed on the substrate; and
- a metal layer disposed above the transistor and supported by the metal post.

13. The semiconductor switching circuit device of claim 12, further comprising a third electrode pad receiving a DC voltage and applying the DC voltage to the transistor, wherein the metal layer is connected to the third electrode pad.

14. A semiconductor switching circuit device comprising:
- a silicon substrate;
- a field effect transistor formed on the substrate and comprising a source electrode, a gate electrode and a drain electrode;
- a first electrode pad connected to the source electrode or the drain electrode;
- a second electrode pad connected to the source electrode or the drain electrode which is not connected to the first electrode pad;
- a metal post standing on a dielectric layer formed on the substrate; and
- a metal layer disposed above the transistor and supported by the metal post.

15. The semiconductor switching circuit device of claim 14, wherein the dielectric layer is a LOCOS film.

16. The semiconductor switching circuit device of claim 14, further comprising a third electrode pad receiving a DC voltage and applying the DC voltage to the transistor, wherein the metal layer is connected to the third electrode pad.

17. A semiconductor switching circuit device comprising:
- a silicon substrate;
- a field effect transistor formed on the substrate and comprising a source electrode, a gate electrode and a drain electrode;
- a first electrode pad connected to the source electrode or the drain electrode;
- a second electrode pad connected to the source electrode or the drain electrode which is not connected to the first electrode pad;
- a metal post standing on a portion of the substrate, the portion being at a ground voltage; and
- a metal layer disposed above the transistor and supported by the metal post.

* * * * *